United States Patent [19]

Sirkin

[11] Patent Number: 4,700,465

[45] Date of Patent: Oct. 20, 1987

[54] METHOD OF SELECTIVELY MAKING CONTACT STRUCTURES BOTH WITH BARRIER METAL AND WITHOUT BARRIER METAL IN A SINGLE PROCESS FLOW

[75] Inventor: Eric R. Sirkin, Mountain View, Calif.

[73] Assignee: Zoran Corporation, Santa Clara, Calif.

[21] Appl. No.: 833,216

[22] Filed: Feb. 25, 1986

Related U.S. Application Data

[62] Division of Ser. No. 574,364, Jan. 27, 1984, abandoned.

[51] Int. Cl.[4] .................... H01L 21/425; H01L 29/62
[52] U.S. Cl. ........................... 437/20; 148/DIG. 140; 357/71; 437/187; 437/189
[58] Field of Search ............... 29/576 B, 590; 427/89, 427/90; 148/DIG. 139, DIG. 140; 357/15, 71

[56] References Cited

U.S. PATENT DOCUMENTS

| | | | |
|---|---|---|---|
| 3,886,577 | 5/1975 | Buckley | 357/2 |
| 3,900,944 | 8/1975 | Fuller et al. | 29/578 |
| 4,141,022 | 2/1979 | Sigg et al. | 357/23 |
| 4,271,424 | 6/1981 | Inayoshi et al. | 357/67 |
| 4,498,224 | 2/1985 | Maeguchi | 29/571 |
| 4,516,313 | 5/1985 | Turi et al. | 29/571 |

Primary Examiner—Olik Chaudhuri
Attorney, Agent, or Firm—Flehr, Hohbach, Test, Albritton & Herbert

[57] ABSTRACT

A semiconductor structure with ohmic contacts and variable resistance contacts has an interconnection pattern to the contacts including a first barrier metal in contact with the variable resistance contacts and a second metal contacting the barrier metal and the ohmic contacts. The barrier layer protects the amorphotized crystalline structure of the variable resistance contacts. Fabrication processes are described.

3 Claims, 14 Drawing Figures

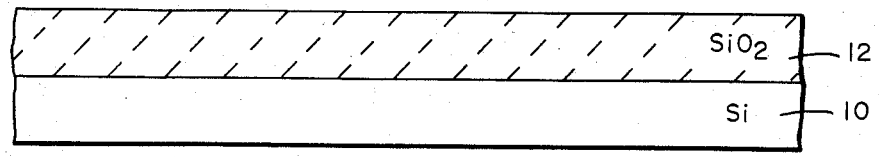
FIG.—IA
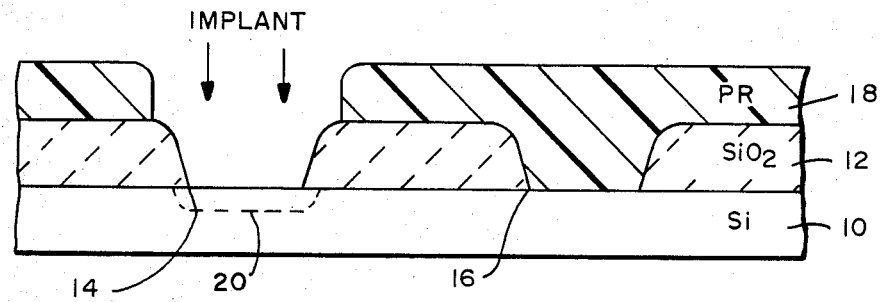
FIG.—IB
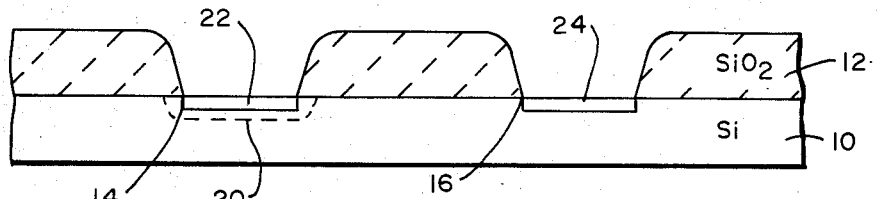
FIG.—IC
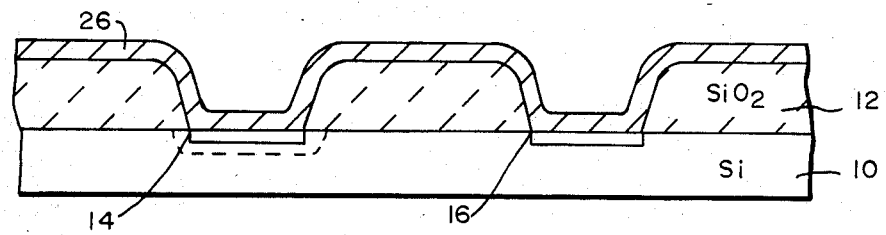
FIG.—ID
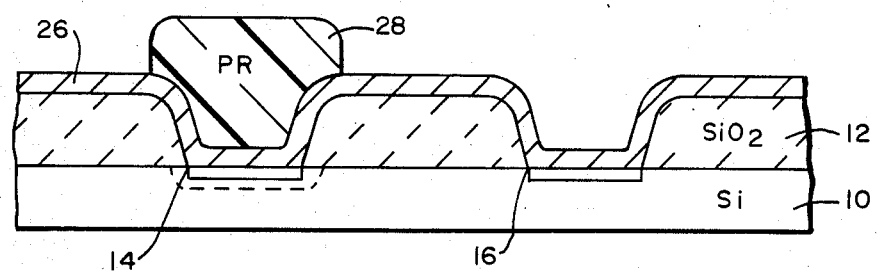
FIG.—IE

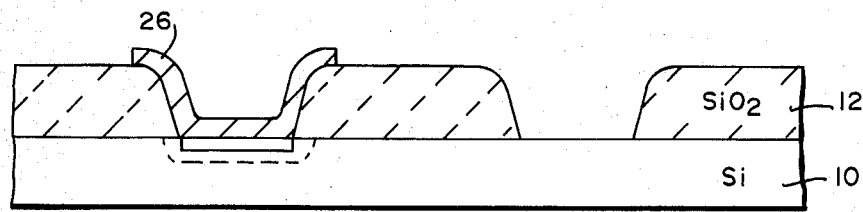
FIG.—1F
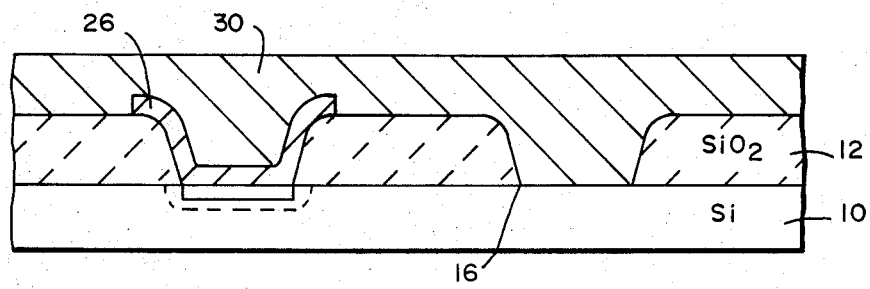
FIG.—1G
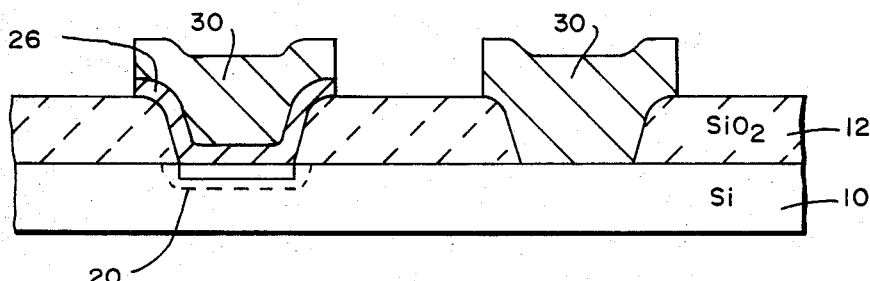
FIG.—1H
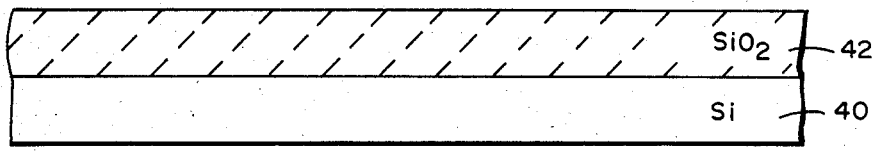
FIG.—2A
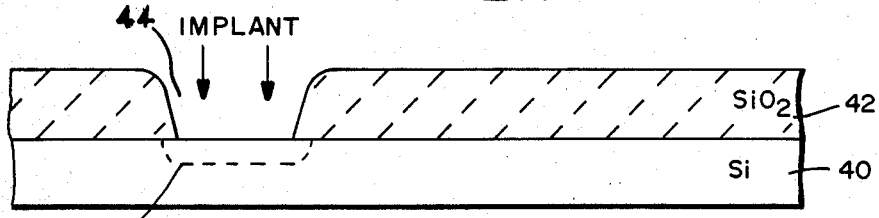
FIG.—2B

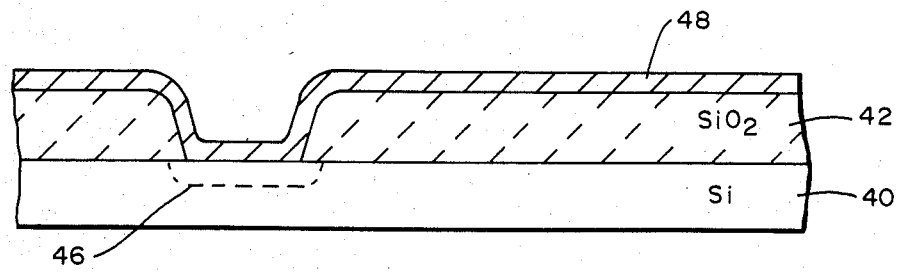
FIG.—2C
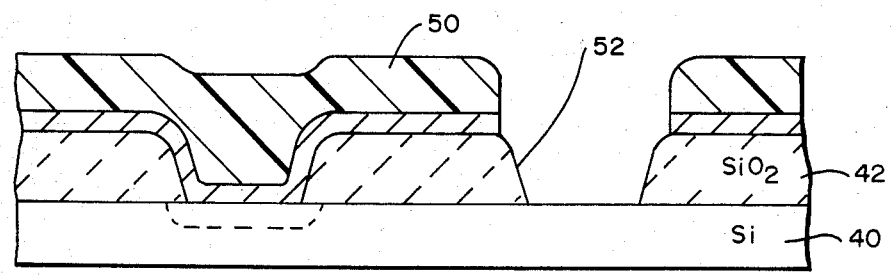
FIG.—2D
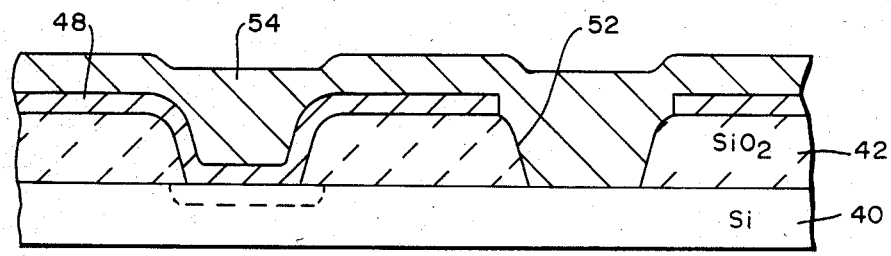
FIG.—2E
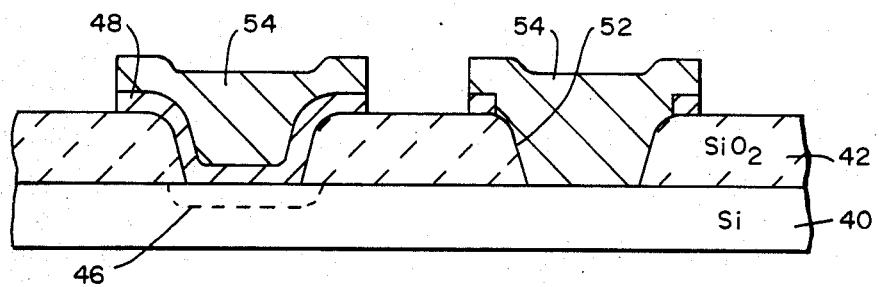
FIG.—2F

METHOD OF SELECTIVELY MAKING CONTACT STRUCTURES BOTH WITH BARRIER METAL AND WITHOUT BARRIER METAL IN A SINGLE PROCESS FLOW

This is a division of application Ser. No. 574,364 filed Jan. 27, 1984, now abandoned.

This invention relates generally to semiconductor device and processing technology, and more particularly the invention relates to a contact structure using a barrier metal and method of making same.

In the fabrication of semiconductor integrated circuits the interconnection of components often employs a conductive metal such as aluminum which contacts device regions of the semiconductor structure. The metal layer is selectively etched to define the desired interconnect pattern.

Disclosed in copending application Ser. No. 06/451,823, filed Dec. 21, 1983 for METHOD AND STRUCTURE FOR SELECTIVELY INTERCONNECTING ELECTRICAL CIRCUIT ELEMENTS and assigned to the present assignee, is a semiconductor contact having a resistance which can be varied by applying a programming voltage across the contact region. The contact includes an amorphous surface region characterized by polycrystalline structure or a crystalline structure having defects which increase the electrical resistance of the surface region. By applying a programming voltage across the surface region, the crystalline structure can be altered or dopants can be activated to reduce the electrical resistance significantly. The variable resistance contact has many applications in tuning or programming linear and digital circuits. Integrated circuits incorporating these programmable contacts will also contain standard, low resistance, non-programmable contacts. The large volume manufactured of these circuits requires that standard processing procedures be maintained particularly for the standard contacts. A major problem in the fabrication of the variable resistance devices occurs when standard aluminum interconnections are used. In order to satisfy chemical equilibria at elevated temperatures, typical of annealing furnaces (400°-500° C.), silicon diffuses from the substrate, through the Al-Si interface and into the aluminum film. When the temperature is subsequently reduced the silicon in the aluminum film precipitates leaving voids at the interface which are filled under electrical stress by aluminum material. Aluminum spikes formed in this fashion destroy the high resistance nature of the variable resistance contacts since the amorphous filler exists in only the top portion of the contact near the interface. The spilling problem is particularly acute due to the preserve of crystal defects and grain boundaries in the amorphous layer.

Another problem which occurs during the processing of the variable contacts is their susceptibility to shorting failure when exposed to hydrofluoric acid (HF) prior to aluminum deposition. This HF treatment is a standard industry practice for cleaning the standard non-programmable contacts. For circuits incorporating the variable resistance contact the HF pre metal deposition treatment can be critical. This is due to the fact that photoresist is used to define those contacts which are exposed to the amorphosizing ion implantation. Due to the high ion doses/currents required the resist cures and becomes difficult to remove. One of the means for removing the resist is to strip it in an $O_2$ plasma. This is commonly accomplished using an asher. During the course of the $O_2$ plasma treatment, a $SiO_2$ layer grows in the standard, low resistance contacts. These contacts will not make low resistance contacts to Si unless this $SiO_2$ is removed by HF or some other means. Thus, the incorporation of the variable resistance contacts in integrated circuit application necessitates a process flow which prevents $SiO_2$ from being present in the standard contacts prior to metal deposition while not exposing the variable resistance contacts to an HF solution. Moreover, a barrier metal must be present in the variable resistance contacts and may or may not be present in the standard contacts.

Accordingly, an object of the present invention is a contact structure for a variable resistance contact which is compatible with conventional semiconductor processing technology.

Another object of the invention is a method of fabricating a semiconductor device having variable resistance contacts and ohmic contacts.

A feature of the invention is a contact structure including a barrier layer between an interconnect pattern and a semiconductor surface region.

In a preferred embodiment of a semiconductor device structure including a semiconductor substrate and surface oriented ohmic and variable resistance contacts, the barrier layer comprises titanium tungsten, molybdenum, tungsten, or titanium nitride. Such barrier layers are compatible with an interconnection layer of aluminum. The contacts can be processed concurrently or independently in accordance with the invention.

The invention and objects and features thereof will be more readily apparent from the following detailed description and appended claims when taken with the drawing, in which:

FIGS. 1A-1H are section views of a semiconductor body illustrating the steps in fabricating a device in accordance with one embodiment of the invention.

FIGS. 2A-2F are section views of a portion of a semiconductor structure illustrating the steps in fabricating a device in accordance with another embodiment of the invention.

Referring now to the drawings, FIG. 1A is a section view of a semiconductor substrate 10 with an insulative layer 12 formed on a major surface of the substrate 10. Typically, the substrate 10 comprises monocrystalline silicon and the insulative layer 12 comprises silicon oxide. Using conventional photoresist masking and chemical etching techniques, openings 14 and 16 are formed through the silicon oxide layer 12, and a photoresist layer 18 is then formed over the silicon oxide layer 12 and selectively removed from the opening 14, as shown in FIG. 1B. Ions and then implanted in a shallow region 20 of the substrate 10 abutting the major surface. The implantation of the ions amorphize the region 10 thereby increasing the electrical resistance thereof, as taught in copending application Ser. No. 06/451,823, supra.

Thereafter, the photoresist layer 18 is removed from the structure through use of an asher oxygen plasma etch. In order to remove all of the photoresist which has been hardened by the ion implantation procedure, the structure is placed in a $H_2SO_4/H_2O_2$ solution which removes all residual resist. However, this procedure also forms thin layers of silicon oxide 22 and 24 in the surface region of the substrate 10 within the openings 14 and 16. This thin layer of silicon oxide can be readily removed by etching in an HF solution, however the etching procedure can damage the amorphized region 20. Importantly, the silicon oxide layer 24 must be removed from the region within opening 16 since this will be an ohmic contact, however the silicon oxide layer 22 is not deleterious to the amorphotized region 20 and can be left in place.

Accordingly, in accordance with the invention a barrier layer is formed over the amorphized region 20 prior to removal of the thin silicon oxide layer 24 in the ohmic contact region. In FIG. 1D a first conductive layer 26 is formed over the subsurface of the silicon oxide layer 12 and the contact regions in the openings 14 and 16. The barrier layer 26 preferably comprises titanium-tungsten, molybdenum tungsten, or titanium nitride. The metal layer is preferably formed by a low temperature sputtering process or alternatively by a chemical vapor deposition process, both of which are well known in the semiconductor processing art.

Thereafter, a photoresist layer 28 is selectively formed over the barrier layer 26 and the opening 14 as shown in FIG. 1E, and the exposed barrier layer 26 is then removed by chemical etchant as illustrated in FIG. 1F. In this process one additional masking step is introduced into the process in defining the photoresist layer 28. The thin silicon oxide layer 24 is removed by HF etchant.

In FIG. 1G a second conductive layer 30 is then formed over the remaining barrier layer 26, the silicon oxide layer 12, and the contact area within opening 16. The second conductive layer 30 may be sputtered aluminum. Finally, the aluminum layer 30 is then etched to define the metal contacts to the contact regions as shown in FIG. 1H.

FIGS. 2A–2F are sectional views of a semi-conductor structure illustrating another processing embodiment in accordance with the invention. In FIG. 2A a semiconductor substrate 40 such as monocrystalline silicon and an insulative layer such as silicon oxide are provided. Using conventional photoresist masking and chemical etching techniques, an opening 44 is formed through the silicon oxide layer 42, as shown in FIG. 2B, and the amorphized region 46 is then formed by ion implantation.

Thereafter, the barrier layer of conductive material 48 is formed over the silicon oxide layer 42 and in contact with the surface of the amorphized region 46.

Thereafter, a photoresist mask 50 is formed over the barrier layer 48, and an opening shown at 52 is then etched through the barrier layer 48 and silicon oxide layer 42. The photoresist mask is stripped, and as shown in FIG. 2E a second conductive layer 54 of aluminum, for example, is then formed over the barrier layer 48 and in the opening 52 in contact with the surface of the silicon substrate 40.

Finally, as shown in FIG. 2F the aluminum layer 54 and barrier layer 48 are selectively etched to form the resulting contact structures over the amorphized contact region 46 and in the ohmic contact region within opening 52.

A semiconductor structure having ohmic contacts and variable resistance contacts and metal interconnections thereto are provided by placing a barrier layer in direct contact with the variable resistance contact. While the invention has been described with reference to two embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating an interconnection for a semiconductor structure including a semiconductor body having a major surface with a plurality of contact regions in said body and abutting said surface, said method comprising the steps of providing a semiconductor body having a major surface, forming an insulative layer over said major surface, forming a plurality of openings through said insulative layer thereby exposing areas of said surface, selectively forming a first layer of photo resist material over said insulative layer and exposing selected contact regions, implanting ions in said selected contact regions, removing said first layer of photo resist material, forming a first layer of conductive material over said insulative layer and said contact regions, selectively forming a second layer of photo resist material on said first layer of conductive material over said selected contact regions, removing exposed portions of said first layer of conductive material, and forming a second layer of conductive material over said insulative layer in contact with said first layer of conductive material over said selected contact regions and in contact with said major surface over other contact regions.

2. A method of fabricating an interconnection for a semiconductor structure including a semiconductor body having a major surface with a plurality of contact regions in said body and abutting said surface, said method comprising the steps of providing a semiconductor body having a major surface, forming an insulative layer over said major surface, removing a portion of said insulative layer thereby exposing said major surface over at least one selected contact region, implanting ions into said at least one selected contact region, forming a first conductive layer over said insulative layer and said at least one contact region, removing said first conductive layer and said insulating layer from at least one additional contact region, forming a second conductive layer over said first conductive layer and said at least one additional contact region, and selectively removing said first conductive layer and said second conductive layer thereby forming contacts to said at least one contact region and said at least one additional contact region.

3. The method of fabricating an interconnection for a semiconductor structure as defined by claim 1 and further including, after the step of forming a plurality of openings, the step of introducing dopants into said semiconductor body through said openings, thereby forming contact regions.

* * * * *